Oct. 13, 1970 R. W. BOWER ET AL 3,534,235

IGFET WITH OFFSET GATE AND BICONDUCTIVITY CHANNEL REGION

Filed April 17, 1967 2 Sheets-Sheet 1

Robert W. Bower,
Hans G. Dill,
INVENTORS.
BY.

W. H. MacAllister Jr.
ATTORNEY.

Fig. 7.
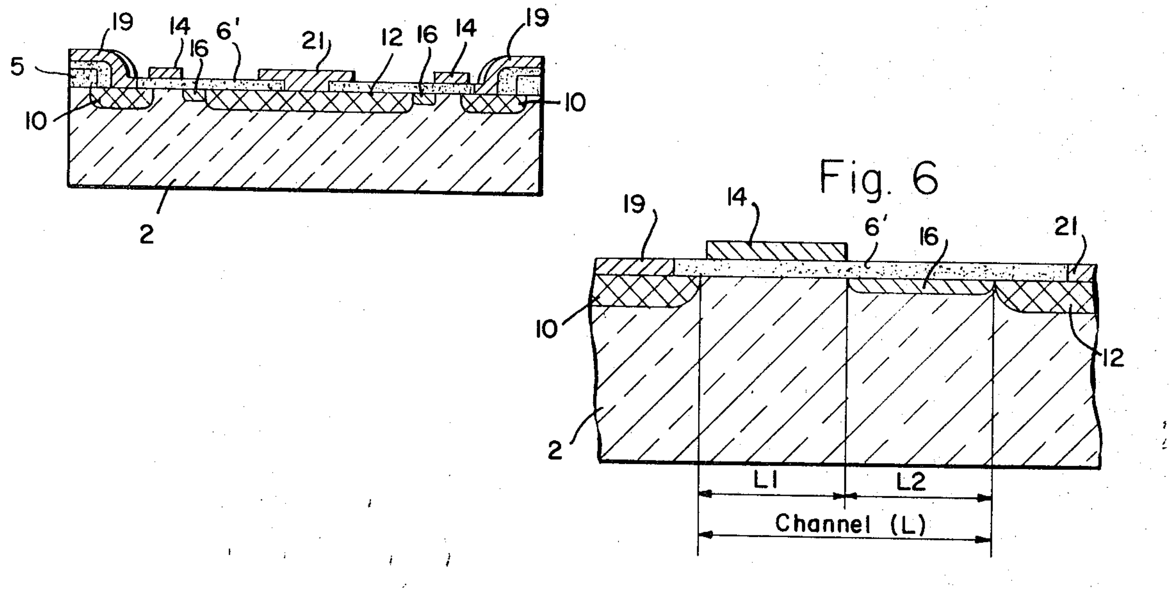
Fig. 7, Fig. 6
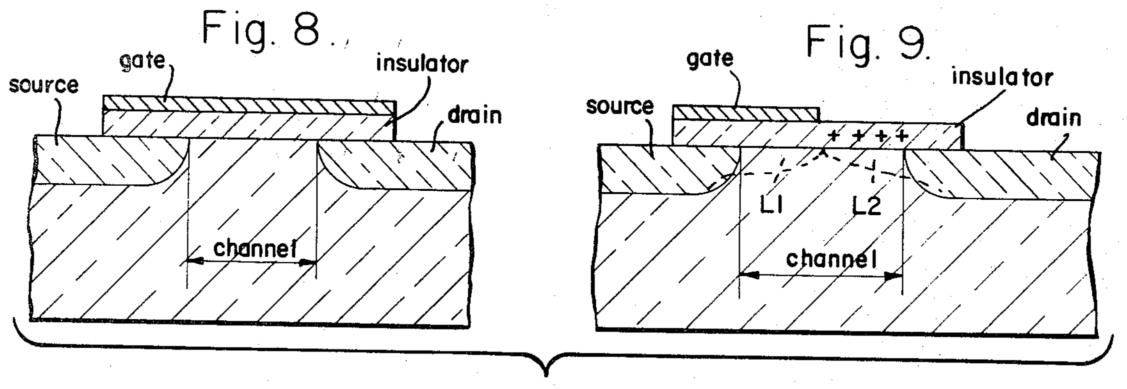
Fig. 8, Fig. 9
Prior Art
Robert W. Bower,
Hans G. Dill,
INVENTORS.
BY.
W. Hurlbut Allister Jr
ATTORNEY.

United States Patent Office 3,534,235

Patented Oct. 13, 1970

3,534,235

IGFET WITH OFFSET GATE AND BICONDUCTIVITY CHANNEL REGION

Robert W. Bower, Palos Verdes, and Hans G. Dill, Costa Mesa, Calif., assignors to Hughes Aircraft Company, Culver City, Calif., a corporation of Delaware Filed Apr. 17, 1967, Ser. No. 631,263
Int. Cl. H01l 11/14, 7/54
U.S. Cl. 317—235 9 Claims

ABSTRACT OF THE DISCLOSURE

Metal-oxide-semiconductor field effect transistor having an insulated gate extending partly over the channel region between the source and drain with a shallow conduction channel layer formed by ion implantation in the portion of the channel region not covered by the gate.

This invention relates to transistor devices and especially to transistor devices in which the conductivity of a relatively shallow region in a semiconductor body is modulated by means of an electric field. More particularly, the invention relates to transistor structures of the type known as insulated gate field-effect transistors.

Operation of transistors of the type to which the present invention appertains is based upon control of the conductivity of a conduction channel in a semiconductor body which channel is induced by an electric field established therein by an insulated control gate as well as by surface charges which may be ionic in nature. The transistors of the present invention are usually formed by deposition and diffusion techniques. In the transistors of the present invention, majority charge carriers (electrons or holes) flow through the solid state semiconductor material from an electrode usually called the "source." The conductive path for these charge carriers, hereinafter called the "channel," is induced by an electric field and surface charges and occurs at surface and near surface regions of the semiconductor body. In the absence of this induced channel, the flow of such charge carriers cannot occur. The charge carriers move or flow in the induced channel toward a second electrode called the "drain." The field effect in the semiconductor is established by a control or "gate" electrode and by this gate the conductivity of the channel and hence the electron or hole current reaching the dran can be varied. This control electrode or "gate" is insulated from the semiconductor material to prevent the majority carriers from flowing to it. Normally these devices are operated in a drain-voltage region where the drain current saturates or reaches a maximum, nearly constant value because the channel is pinched off or terminated very close to the drain region and acts as a current generator, the current being only a function of the gate voltage and not of the drain voltage. Thus these devices basically exhibit the useful drain voltage-drain current characteristic similar to a vacuum pentode.

Such devices are known in the art and the structure and operation thereof have been amply described, especially by Hofstein and Heiman in an article entitled "Silicon Insulated-Gate Field-Effect Transistor" published in the September 1962 Proceedings of the I.E.E.E. commencing on page 1190. In one arrangement, the field effect transistors have the source and drain electrodes disposed side by side with the gate arranged over the space between the source and drain and separated therefrom by an insulator. A typical prior art arrangement is shown in FIG. 8 hereof as well as in the above-mentioned article by Hofstein and Heiman. The gate electrode is insulated from the semiconductor material so that the gate electrode will not itself act as a source or drain electrode and may yet exert its control by field effect in the space between the source and drain electrodes.

It will be appreciated from the prior art field effect devices that the usual arrangement is for the gate, which is generally of metal, to overlap the source and drain electrodes or portions of the device. This permits the channel region between the source and drain to be completely modulated by the gate. It also reduces somewhat fabrication mask alignment problems since the channel region can be made small without the necessity of trying to fit an extremely narrow gate precisely over the channel region. Such prior art field effect devices suffer, however, from the fact that the gate electrode overlaps the drain electrode which results in a substantial degree to the introduction of an undesirable feedback capicitance usually referred to as Miller feedback capacitance. In addition, the useful drain potential of these devices is limited by a high field breakdown on the drain by avalanche multiplication due to the field between the gate and the drain in the pinch-off region. This means that the breakdown potential of the drain is undesirably low.

Solutions to these problems have been sought by utilizing a "half gate" or an offset gate arrangement disposed away from the drain. In such approaches, the gate overlaps a portion of the source electrode and extends only partially (halfway, for example) across the channel region. It will be appreciated that such a solution suffers a possible reduction in the gate coverage of the channel region, portions of which may now be unmodulated. On the other hand, the half-gate arrangement shown in FIG. 9 hereof offers the promise of a low Miller feedback capacitance and a high drain breakdown potential. Nevertheless, in addition to the unmodulated portion of the channel, the structure is not altogether satisfactory for the following reasons. In the first place, while there will be a conduction channel, $L_1$, under the insulated gate portion of the device, some means must be provided to bridge the gap in the channel region by a second conduction channel, $L_2$, between the $L_1$ conduction channel and the drain. This may be accomplished as shown in FIG. 8 by extending the gate insulation over the channel region to the drain and by relying on the formation of a second conduction channel, $L_2$, thereunder due to induction by charges in the insulation layer. Among the chief drawbacks to this arrangement is the difficulty in easily reproducing ionic charges in the insulation material. Also, such charges are unpredictably unstable under electric field and temperature stresses. This is particularly true in the case of the silicon dioxide insulation films which are usually employed. Secondly, the half-gate arrangement is restricted to the use of a channel of N-type conductivity because positive charges are dominant in silicon oxide films. Thirdly, the drain series resistance is increased because of the tendency of positive charges in the gate insulation material, which is not covered by the gate itself, to migrate, particularly under the effect of relatively high heat and electric fields. Such migration is usually away from the insulator-semiconductor interfaces. One solution to these problems is disclosed in the co-pending application of H. G. Dill, Ser. No. 562,971, filed July 1, 1966; and assigned to the instant assignee. The solution proposed in that application involves the use of an additional gate member superimposed above and insulated from the half-gate. While such an arrangement is eminently satisfactory as far as electrical performance is concerned, it does introduce additional problems in fabrication.

It is an object of the present invention to provide an improved field effect device.

A further object of the invention is to provide an improved field effect transistor of the insulated gate type characterized by high drain breakdown potential which can be optimized.

Another object of the invention is to provide an improved field effect transistor of the insulated gate type and characterized by low Miller feedback capacitance and high drain breakdown potential.

Still another object of the invention is to provide an improved field effect transistor having a source-drain channel effectively controlled by an insulated gate structure.

These and other objects and advantages of the invention are realized in a field effect transistor structure by employing an insulated half-gate or control electrode which is disposed over a portion of the channel region between the source and drain and is electrically insulated therefrom, and by forming an additional conduction channel, $L_2$, extending from the conduction channel, $L_1$, underlying the insulated gate by ion implanting a relatively shallow, substitutional impurity layer. In general, the half-gate covers only the source side of the channel region.

The invention will be described in greater detail by reference to the drawings in which:

FIG. 6 is an enlarged cross-sectional view in elevation of a portion of the device shown in FIG. 5 illustrating in detail the relationships of the conduction channel region and the gate according to the invention;

FIG. 7 is a cross-sectional elevational view of the completed device shown in FIG. 5;

FIG. 8 is an enlarged cross-sectional view in elevation of a portion of a field effect device according to the prior art; and FIG. 9 is an enlarged cross-sectional view in elevation of a portion of another field effect device according to the prior art.

Referring now to FIGS. 1 through 7, the fabrication of a field effect transistor device as shown will be described. It should be understood that while the fabrication of a single device is described, in practice a large number of identical devices on a common semiconductor body may be formed simultaneously and subsequently separated therefrom to yield discrete devices.

Figure 1:
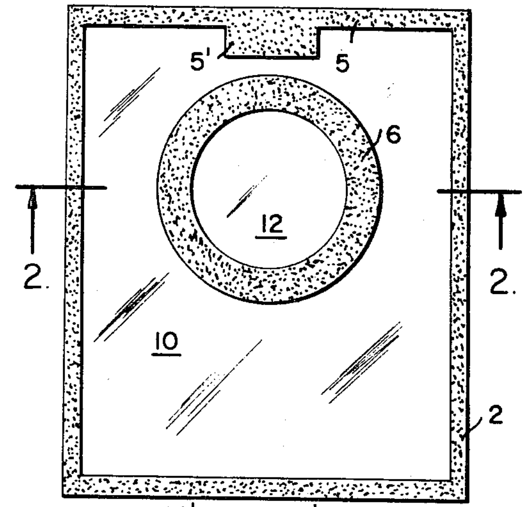
FIG. 1 is a plan view of a field effect device according to the invention at an initial step in the manufacture thereof.
Figure 2:
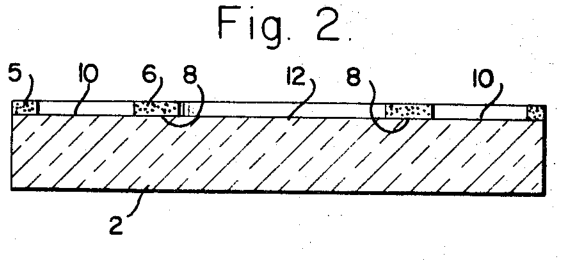
FIG. 2 is a cross-sectional elevational view of the device shown in FIG. 1 taken along the line 2—2 thereof.

FIGS. 1 and 2 show a semiconductor body 2 which may be of N-type silicon, for example, having a typical resistivity of about 10 ohm-cm. A surface of the semiconductor body 2 is provided initially with an over-all masking layer whose primary function is to prevent the penetration therethrough and into the semiconductor body any unwanted impurities and especially those which affect the conductivity type of the semiconductor body. A suitable material for this purpose is silicon dioxide which may be formed by heating the silicon semiconductor body 2 in an oxidizing atmosphere. Typically, such a masking layer may be provided by heating the silicon body 2 to about 1150° C. in steam until a layer of silicon dioxide about 0.6 to 0.8 micron thick is obtained. Thereafter, by known resist masking and etching techniques, portions of the oxide layer are removed so as to expose surfaces of the silicon body 2 as shown in FIGS. 1 and 2. Specifically, an oxide peripheral portion 5 and a tab-like portion 5' connected thereto of oxide as well as an oxide annular portion 6 remain on the surface. The width of the annular mask portion 6 may be such as to eventually provide an N-type region 8 thereunder of about 12 microns wide, for example, hereinafter called the channel region which separates the source and drain of the device, indicated by reference numerals 10 and 12 in the FIGS. 1 and 2 though it will be understood that the source and drain are not yet formed at this point in the process.

Figure 3:
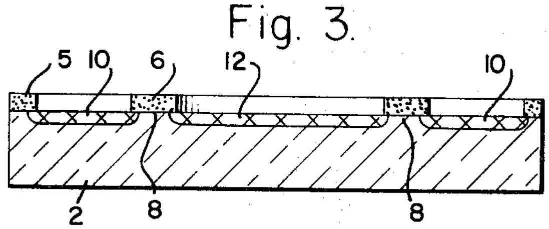
FIG. 3 is a plan view of the device shown in FIG. 2 at a further stage in fabrication thereof.

The next step is to form the source and drain regions 10 and 12 by diffusing a P-type impurity into the silicon body 2 from the exposed surfaces of the body. Such diffusion processing is well known in the art and need not be extensively described herein. This step is carried out by exposing the masked and unmasked surface of the silicon body to the vapor of a P-type impurity such as boron, for example, while maintaining the silicon body 2 at a temperature of about 1100° C. Atoms of the impurity penetrate the silicon body at the exposed surfaces thereof and convert the conductivity type of these surface and near-surface portions to P-type while having the oxide-protected portions of the silicon body unaffected. Thus, as shown in FIG. 3, P-type source and drain regions 10 and 12 are formed in the silicon body 2 and separated from each other by the N-type channel region 8 which remains after the diffusion operation and unaffected thereby.

Figure 5:
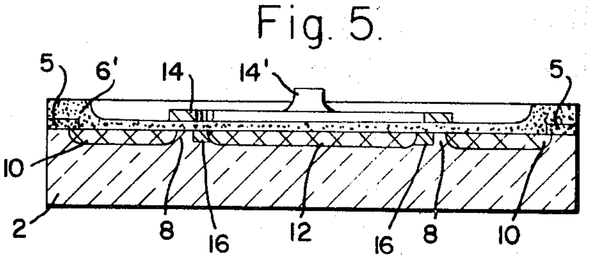
FIG. 5 is a cross-sectional elevational view of the device shown in FIG. 4 taken along the line 5—5 thereof.
Figure 4:
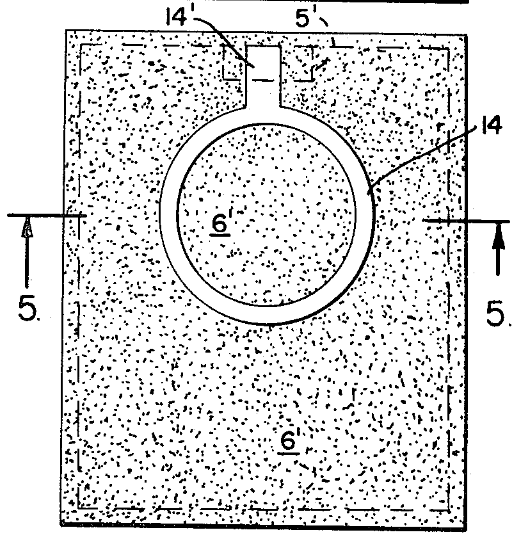
FIG. 4 is a plan view of the device shown in FIG. 3 at still another stage in the fabrication thereof.

After formation of the source and drain regions 10 and 12, the silicon oxide masking ring 6 is removed leaving only the peripheral and tab-like portions 5, 5' remaining on the surface. Insulation for the gate electrode 14 is then formed by completely covering the entire surface of the silicon body 2 with a new layer 6' of oxide as shown in FIGS. 4 and 5. This oxide layer 6' will thus cover the channel, source and drain regions 8, 10 and 12, respectively, as well as the initial peripheral and tab-like oxide regions 5, 5'. This gate insulation layer 6' of oxide is very thin and may be from 0.1 to 0.2 micron thick. The oxide layer 6' may be provided by heating the silicon body 2 to a temperature of about 1025° C. in steam, for example.

Referring now to FIGS. 4 and 5, by means of a mechanical-like mask plate (not shown), the gate electrode member 14 is provided by vapor-depositing or otherwise forming an electrically conductive, substantially annular layer over the insulating oxide layer 6' and disposed over the channel region 8 so as to extend from over the source region 10 to a point about midway across the channel region 8. Thus, if, as stated illustratively above, the channel region 8 is about 12 microns wide, the gate electrode 14 will extend from the source side thereof and over the channel to a distance of about 6 microns. The disposition of the gate electrode member 14 with respect to the channel region 8 may be more clearly seen in FIG. 6. The gate electrode member 14, while substantially annular, is provided with an integral tab-like portion 14' which extends outwardly and over the oxide tab-like portion 5'. Since this oxide tab-like portion 5' has an additional oxide layer thereover, it is relatively thick so that the gate tab portion 14', as seen in FIG. 5, extends above the principal plane of the gate electrode member 14. The purpose of the gate tab portion 14' is to provide a convenient electrical contact for the gate member itself. The gate electrode member 14 and its tab portion 14' may be formed by vapor-depositing a film of metal such as aluminum, chromium or gold to a thickness of about 1000 to 4000 A. over the entire oxide layer 6'. The ring gate electrode 14 and its tab 14' are then formed by masking the metal and removing the same from unwanted areas by etching. Underlying the gate 14 and the portion of the insulation layer 6' thereunder, a first conduction channel, $L_1$, is indicated in FIG. 6.

With reference now to FIG. 6, the next step is to provide a second conduction channel, $L_2$, in the channel region 8 extending from the first conduction channel $L_1$ to the drain region 12. According to the invention, this conduction channel $L_2$ is formed by a shallow, intentionally doped impurity layer 16 in the channel region 8 which doping is accomplished by ion implantation. As is well understood, the term "doping" is employed to mean the intentional introduction of a conductivity-type-determining impurity into a semiconductor body and one well-known doping method is diffusion. No matter what method is utilized, what is ultimately required is the introduction of atoms capable establishing the desired type of conductivity in a semiconductor body and which atoms are also capable of being positioned and controlled as to velocity and direction. Thus, in the conventional diffusion process, while there is a supply of atoms capable of establishing the requisite conductivity, by and large these atoms are usually in a vapor state and are not controllable except by thermodynamic techniques. In effect, the atoms in a diffusion process "drift" into contact with an exposed surface of a semiconductor body and continue to drift into the semiconductor body in a more or less random fashion in accordance with thermodynamic principles. In an ion implantation process, the impurity atoms, which are otherwise of neutral charge or polarity, are given a predetermined electrical charge or "ionized." Such charge atoms are therefore referred to herein as ions. By means of electric fields, these ions may then be formed in beams of various cross-sectional diameters and shapes and may also be caused to travel in predetermined directions at predetermined velocities much like the electrons in an electron beam. In short, therefore, instead of drifting into the lattice structure of a semiconductor body in random directions, these ions may be made to enter the lattice in a predetermined direction and may be positioned where desired therein. In addition, the concentration of such impurities in the semiconductor body is readily controllable and may be made uniform or graded throughout the implanted region as desired. To sum up, ions of a desired conductivity-type-determining impurity may be made to enter a semiconductor body in a fixed and desired direction with little or no deviation therefrom and may be placed therein where desired to establish a region of given conductivity type of precise geometry and depth. One of the important advantages of the process is the fact that the semiconductor body need not be heated to excessive temperatures (i.e., above 550° C.) which in other doping processes often deleteriously affects the semiconductor and renders precise control of a device during fabrication tedious and expensive. This process is fully described in the co-pending application of R. W. Bower, Ser. No. 590,033 filed Oct. 27, 1966, and assigned to the instant assignee. Using the gate member 14 as a mask against ion implantation as taught in this copending application of R. W. Bower, and by suitably masking other portions of the device as with a template-type mask against ion implantation, the surface of the channel region 8 between the conduction channel portion $L_1$ and the drain region 12 is left exposed and ions of P-type conductivity are introduced in this exposed portion of the semicoductor body as taught in the aforementioned co-pending application of R. W. Bower to form a second conduction channel, $L_2$, constituted by a shallow layer 16 in the semiconductor body which layer is of P-type conductivity and about 400 to 3000 A., for example, thick.

Thereafter, in order to provide electrical connections to the source and drain regions of the device, portions of the insulation layer 6′ are removed by conventional resist-masking and etching procedures to expose corresponding surface portions of the source and drain regions 10 and 12, respectively, as shown in FIGS. 6 and 7. It will be understood that the insulation may remain elsewhere on the surface except at these portions. It is also possible to form these connections during the step of providing the gate member 14, if desired.

With reference now to FIG. 7, a layer of metal such as aluminum may be vapor-deposited over the entire surface of the device and specifically over the insulation layer as well as over the exposed source and drain surfaces. The thickness of this metal layer may typically be about 4000 A. By the aforementioned photoresist masking and etching procedures, the deposited metal is left on the exposed portions of the source and drain electrode regions 10 and 12 to permit easy electrical connections to be made thereto. Thus electrical connections are provided to the source region of the device by means of the metal layer 19 and to the drain region by the metal portion 21. Electrical connection to the gate member 14 is provided by the metal tab 14′ with all connections to the device being provided on the same surface of the device.

Thus it will be appreciated that a device has been provided wherein a gate electrode member 14 extends only partly across the channel region 8 between the source electrode 10 and the drain electrode 12 and a second conduction channel, $L_2$, is provided a shallow, ion-implanted layer 16 between a first conduction channel, $L_1$, to the drain region.

Since half-gate prior art devices of the type described and shown in FIG. 8 depend upon rather unreliable induced surface charges for operation, it is a major advantage of the present invention to provide a conduction channel layer where the half-gate does not cover the channel region 8 between the source and drain electrode members. This makes it possible to fabricate a field effect device having either a P-type or N-type channel whereas the half-gate devices of the prior art are limited to operating only with N-type channel regions.

There thus has been described a novel insulated gate field effect transistor device whose high drain breakdown potential makes it especially useful as a power amplifier. Devices according to the present invention have been built with a useful drain voltage range of up to 200 volts, and it appears that the only ultimate limit for the drain breakdown potential is the bulk breakdown of the drain function itself. In addition, Miller feedback capacitance which is important for the high frequency stability of any amplifier is very low in devices according to the invention, and even approaches values familiar with vacuum tube pentodes.

What is claimed is:

1. A field effect transistor device comprising a semiconductor body having spaced source and drain regions disposed at a common surface thereof, a channel region having a predetermined type of conductivity disposed between said source and drain regions and having a surface co-planar with said common surface, a gate electrode extending from over said source region partially over and electrically insulated from the surface of said channel region, and a shallow region of opposite conductivity to said channel region disposed in said channel region at the surface thereof and extending from said drain region toward said source region.

2. A field effect transistor device according to claim 1 wherein said gate electrode extends from over said source region about halfway across said channel region and said shallow region extends from said drain region about halfway across said channel region.

3. A field effect transistor device comprising a semiconductor body of a first conductivity type and having spaced source and drain regions of opposite conductivity type disposed at a common surface thereof, a channel region of said first type of conductivity disposed between said source and drain regions and having a surface coplanar with said common surface, electrical insulating means covering at least a portion of the surface of said channel region adjacent said source region, a gate electrode disposed on said electrical insulating means and extending partially over said channel region from over said source region, and a shallow region of opposite conductivity type to said first type disposed in said channel region at the surface thereof and extending from said drain region toward said source region.

4. A field effect transistor device according to claim 3 wherein said semiconductor body and said channel region are of P-type conductivity, said source and drain regions are of N-type conductivity, and said shallow region is of N-type conductivity.

5. A field effect transistor device according to claim 3 wherein said semiconductor body and said channel region are of N-type conductivity, said source and drain regions are of P-type conductivity, and said shallow region is of P-type conductivity.

6. A field effect transistor device comprising a semiconductor body of a first type of conductivity, a diffused source region of opposite conductivity to said first type disposed in said semiconductor body, a diffused drain region of opposite conductivity to said first type disposed in said semiconductor and spaced from said source region, a channel region formed by the portions of said semiconductor body between said source and drain regions, a layer of electrically insulating material disposed over portions of said source and drain regions and over the surface of said channel region therebetween, a gate electrode disposed on said layer of electrically insulating material and extending from over said source region partially over the surface of said channel region, and an ion-implanted region of opposite conductivity to said first type disposed in said channel region at the surface thereof and extending from said drain region toward said source region.

7. A field effect transistor device according to claim 6 wherein said semiconductor body is silicon and said layers of electrically insulating material are silicon oxide.

8. A field effect transistor device comprising a semiconductor body having spaced source and drain regions disposed at a common surface thereof, a channel region having a predetermined type of conductivity disposed at said common surface between said source and drain regions, a gate electrode disposed over only a portion of said channel region and electrically insulated therefrom, and a surface region of opposite conductivity to said predetermined type disposed in said channel region other than that over which said gate electrode is disposed.

9. A field effect transistor device comprising a semiconductor body of a first conductivity type and having spaced source and drain regions of opposite conductivity type disposed at a common surface thereof, a channel region of said first type of conductivity disposed at said common surface between said source and drain regions, electrical insulating means covering at least a portion of the surface of said channel region, a gate electrode disposed on said electrical insulating means and over only a portion of said channel region, and a surface region of the same conductivity type as that of said source and drain regions disposed in said channel region and other than that over which said gate electrode is disposed.

References Cited

UNITED STATES PATENTS

| | | | |
|---|---|---|---|
| 3,411,199 | 11/1968 | Heiman | 29—571 |
| 3,296,508 | 1/1967 | Hofstein | 317—235 |
| 3,305,708 | 2/1967 | Ditrick | 317—234 |
| 3,434,021 | 3/1969 | Hofstein | 317—235 |

JOHN W. HUCKERT, Primary Examiner

M. H. EDLOW, Assistant Examiner

U.S. Cl. X.R.

148—1.5, 187